(12) United States Patent
Gundlach et al.

(10) Patent No.: US 7,719,291 B2
(45) Date of Patent: May 18, 2010

(54) CAPACITIVE SENSOR

(75) Inventors: Jochen Gundlach, Wasserburg (DE); Jaromir Palata, Friedrichshafen (DE)

(73) Assignee: i f m electronic GmbH, Essen (DE)

( * ) Notice: Subject to any disclaimer, the term of this patent is extended or adjusted under 35 U.S.C. 154(b) by 160 days.

(21) Appl. No.: 11/953,543

(22) Filed: Dec. 10, 2007

(65) Prior Publication Data
US 2008/0191717 A1 Aug. 14, 2008

(30) Foreign Application Priority Data
Dec. 10, 2006 (DE) .................. 10 2006 058 442

(51) Int. Cl.
*G01R 27/26* (2006.01)
(52) U.S. Cl. .................. 324/686; 324/658; 324/682
(58) Field of Classification Search .......... 324/686, 324/682, 658
See application file for complete search history.

(56) References Cited
U.S. PATENT DOCUMENTS 3,816,811 A * 6/1974 Cmelik K. .................. 324/667
3,986,109 A * 10/1976 Poduje .................. 324/662
4,287,471 A * 9/1981 Ko et al. .................. 324/725
5,650,730 A 7/1997 Herbst, Jr.
5,793,217 A * 8/1998 Herbst, Jr. .................. 324/690

* cited by examiner

*Primary Examiner*—Timothy J Dole
*Assistant Examiner*—Farhana Hoque
(74) *Attorney, Agent, or Firm*—David S. Safran; Roberts Mlotkowski Safran & Cole, P.C.

(57) ABSTRACT

A capacitive sensor with at least one reference impedance (2) and at least one measuring condenser (3), at least one electrical alternating signal source (4), a current supply network (5) and an analysis unit (6) in which the reference impedance (2) and the measuring condenser (3) are connected via the current supply network (5) to the alternating signal source (4) and the analysis unit (6) in such a way that the charge and discharge currents of the reference impedance (2) and the measuring condenser (3) and/or an analysis signal from the analysis unit (6) that characterizes the charge and discharge currents of the reference impedance (2) and the measuring condenser (3) can be analyzed. As a result, the reference impedance (2) can be tuned. The capacitive sensor avoids—at least partially—drawbacks in the capacitive sensors known from the prior art in that the reference impedance can be tuned.

20 Claims, 10 Drawing Sheets

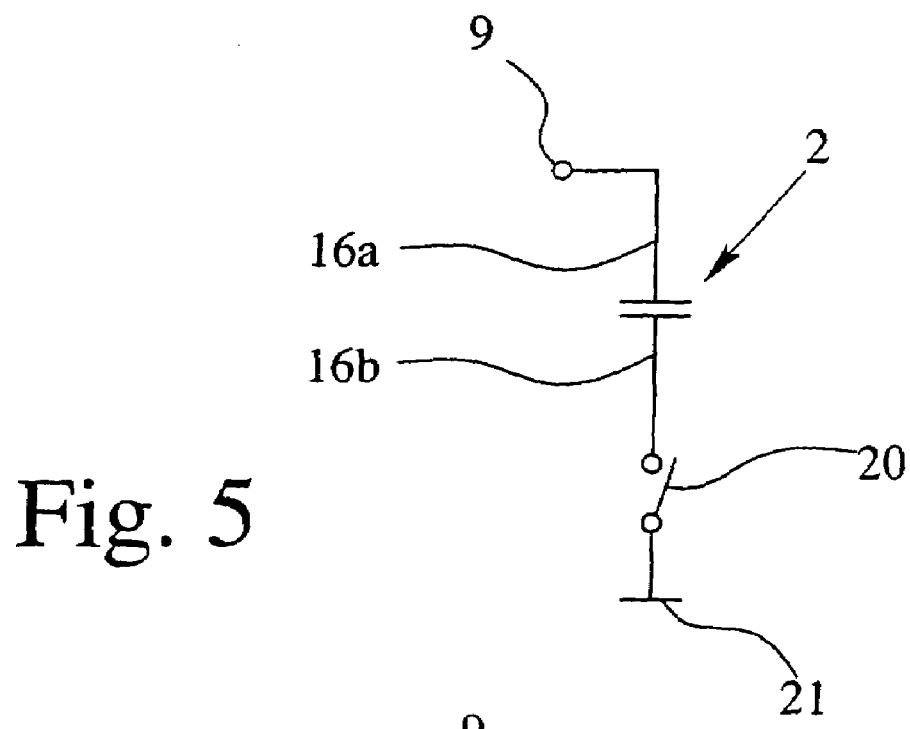
Fig. 5
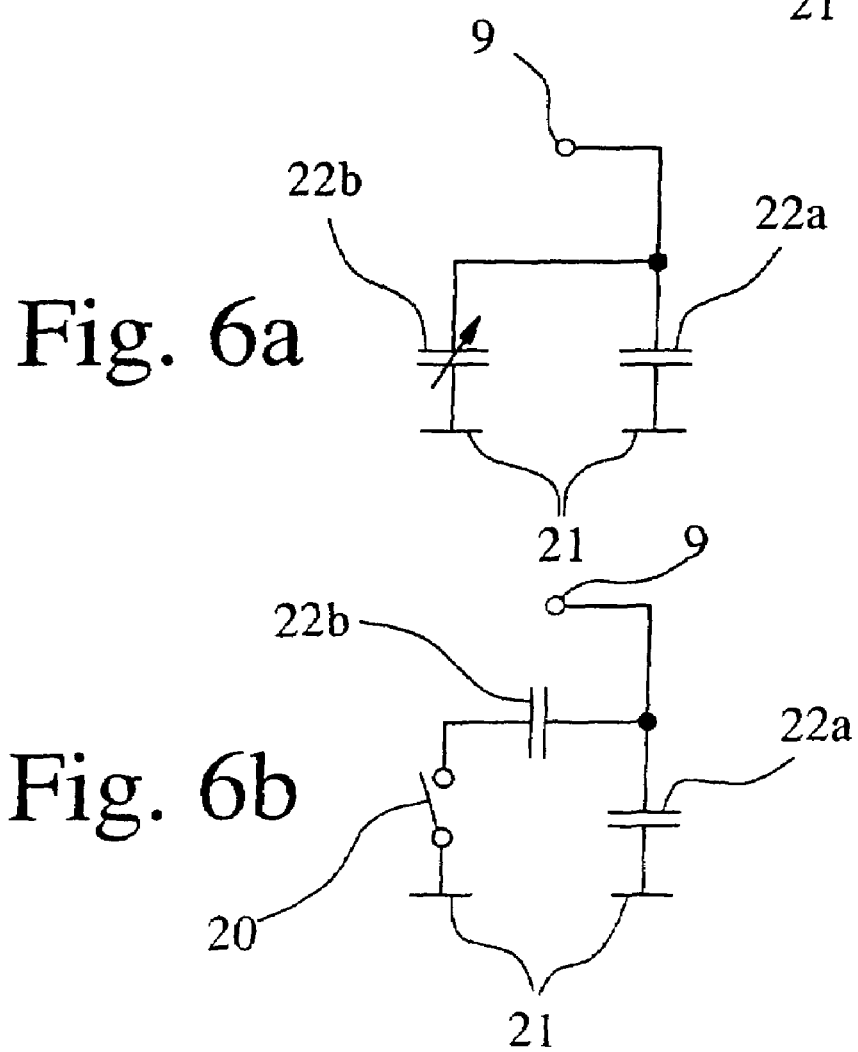
Fig. 6a
Fig. 6b

CAPACITIVE SENSOR

BACKGROUND OF THE INVENTION

1. Field of Invention

The invention relates to a capacitive sensor with at least one reference impedance and at least one measuring condenser, with at least one electrical alternating signal source, with a current supply network, as well as with an analysis unit, whereby the reference impedance and the measuring condenser are connected via the current supply network to the alternating signal source and the analysis unit such that the charge and discharge currents of the reference impedance and the measuring condenser can be analyzed by the analysis unit.

2. Description of Related Art

Capacitive sensors of the initially mentioned type are known from, for example, the U.S. Pat. Nos. 5,650,730 and 5,793,217 and are used for determining the capacitance of the measuring condenser or the change in the capacitance of the measuring condenser. These sensors have a special current supply network, namely such a one that consists of diodes, connected in series, which form a diode ring.

In the capacitive sensor itself, often only one electrode of the measuring condenser is designed, and the other electrode of the measuring condenser is formed by the surrounding area of the capacitive sensor. The measuring condenser is thus normally not a condenser in terms of a complete electrotechnical component, but rather an arrangement that is equipped with a capacitance whose active electrode is assigned to the capacitive sensor, whereby an electrical stray field extends from the active electrode into the surrounding area.

In the prior art, in most cases, a reference condenser is used as a reference impedance. Where there is concrete mention below of a reference capacitance, the embodiments still generally also apply to a reference impedance; the capacitance of the reference condenser then corresponds to the value of the reference impedance, independently thereof, as the reference impedance is implemented as a component. The charge and discharge currents of a reference condenser then correspond to the charge and discharge currents of a reference impedance, whereby the reference impedance can convert the energy supplied to it in some other way than only in the electric field of a condenser.

The capacitance of the above-described sensor can be changed, on the one hand, if the geometry of the arrangement, and thus, the stray field of the active electrode is changed; on the other hand, the capacitance of the sensor—without a change in the extension of the stray field—can also change in an alteration of the dielectric properties of the space, in which the electric field extends. Because of these general properties, capacitive sensors are frequently used as proximity switches and as fill-level detectors.

In capacitive sensors of the initially described type, the alternating signal source is usually designed as an oscillator, such as, for example, as a harmonic oscillator in the form of an LRC network, which is switched in such a way that it executes a continuous oscillation. As the signal level within the positive semioscillation of the alternating signal increases, the measuring condenser is charged via a current that flows over a first path of the diode ring, and the reference impedance—frequently designed as a reference condenser—is charged during the latter with a current that flows over a second path of the diode ring. The charge current that flows over one path in each case is derived as a discharge current via the respective other path.

The mode of operation of the above-described capacitive sensor is consequently based on the fact that the charge current of the reference impedance, which can be configured in particular as a reference condenser, or the charge current of the measuring condenser in each case flows over a path of the sensor or the current supply network that is different from the discharge current of the reference condenser or the measuring condenser. If the capacitances of the reference condenser and the measuring condenser are equally large, the current that flows in via the first path or the second path on average is equal to the current that flows out from the first path or from the second path of the current supply network that is designed as a diode ring. If the capacitances of the reference condenser and the measuring condenser vary in size, however, a resulting current is produced in the time mean in each path of the current supply network that is designed as a diode ring. By analyzing the differential currents of the charge and discharge currents that flow into the first and second paths of the current supply network, it is evident what the ratio is between the capacitance of the measuring condenser and the capacitance of the reference condenser.

In the generic capacitive sensors known from the U.S. Pat. Nos. 5,650,730 and 5,793,217, the currents that flow via the reference condenser and the measuring condenser into the analysis unit are fed via two current-voltage transformers to an adder, which processes the voltages with different signs so that a differential signal results. This differential signal is ultimately—after possible additional intermediate steps pertaining to circuit engineering—compared to a reference or threshold signal, whereby the reference signal defines a threshold, which, when reached, indicates a specific event, such as, e.g., a sufficient proximity of an object to the capacitive sensor or the presence/absence of a specific fill level.

The disadvantage to the above-described capacitive sensor is that the analysis of the current signals in the analysis unit is comparatively expensive. In particular, the presetting of a reference value, to which the difference of the current-voltage-converted currents is compared, is labor-intensive and costly in terms of circuit engineering, and in addition, is prone to frequency and amplitude fluctuations of the alternating signal. Furthermore, it has been found that the known sensors in the working frequency of 2 MHz indicated in the prior art are not suitable to be used as fill-level sensors, since they are not able to distinguish whether a medium fills a larger area of volume around the sensor or whether only a small adhesion of this medium to the sensor has remained after the medium that is to be monitored has left the area of the capacitive sensor; the fill level thus has dropped below the position of the capacitive sensor. Also, the above-described capacitance sensors are not suitable for interval operation, since, when the triggering of the current supply network is turned off, the differential current as the signal to be analyzed is also immediately brought together with the alternating signal from the alternating signal source and can no longer be used for another analysis.

SUMMARY OF THE INVENTION

The object of this invention is to avoid—at least partially—the indicated drawbacks in the known capacitive sensors of the type in question here.

The capacitive sensor according to the invention, in which the previously deduced and indicated object is achieved is characterized, first and essentially, in that the reference impedance can be tuned and in that, in addition or alternatively to the charge and discharge currents, an analysis signal that characterizes the charge and discharge currents of the reference impedance and the measuring condenser is prepared that can be analyzed directly by the analysis unit.

By this simple measure, the value of the reference impedance—and thus also the capacitance of a reference impedance that is configured as a reference condenser—can be adjusted, in any desired state of influence of the capacitive sensor, to the impedance or capacitance of the measuring condenser that is tied to the state of influence. Because of the ability to make adjustments within the area of the actual capacitive sensor, no ability to make adjustments or to set a zero point within the analysis unit is needed, so that the analysis unit can be produced significantly more simply and economically in terms of circuit engineering.

In an especially preferred configuration of the invention, it is provided that the current supply network comprises at least a first switch unit with a high-impedance input, with a low-impedance output, and with two operational voltage connections as well as a second switch unit with a high-impedance input, with a low-impedance output and with two operational voltage connections, whereby the first switch unit and the second switch unit are connected to one another at a common connecting point via an operational voltage connection in each case and form a voltage divider of an essentially constant operational voltage. In this case, it is also provided that the alternating signal from the alternating signal source strikes the input of the first switch unit and the input of the second switch unit, whereby the output of the first switch unit is connected to the first electrode of the tunable reference impedance, and the second electrode of the reference impedance is connected to a reference potential, and the output of the second switch unit is connected to the first electrode of the measuring condenser, whereby the analysis signal that characterizes the charge and discharge currents of the reference impedance and the measuring condenser can be tapped off at the connecting point—in particular, by the analysis unit.

By the high-impedance input of the first switch unit and the high-impedance input of the second switch unit, first, considerably less output from the alternating signal source is necessary to actuate the current supply network in a suitable way than is the case in, for example, the current supply network that consists of a diode ring and that is known from the prior art, since the diode ring is distinguished overall by a pronounced low impedance. Despite this, the reference impedance that is associated with the output of the first switch unit and the measuring condenser that is associated with the output of the second switch unit can be actuated easily, since both the output of the first switch unit and the output of the second switch unit are designed at a low impedance.

The reference impedance that is connected to the output of the first switch unit and the measuring condenser that is connected to the output of the second switch unit influence as a whole the impedance of the first switch unit and the impedance of the second switch unit, such that the operational voltage drops via the first switch unit and the second switch unit drops in the ratio, via the first switch unit and the second switch unit, between the impedance of the first switch units and that of the second switch unit. When the first switch unit and the second switch unit are built up identically, the ratio of the voltages dropping via the first switch unit and the voltages dropping via the second switch unit depends essentially only on the impedances that are connected to the output of the first switch unit and to the output of the second switch unit. If the value of the reference impedance that is connected to the output of the first switch unit is equal to the value of the impedance of the measuring condenser that is connected to the output of the second switch unit, the operational voltage is divided into equal parts via the first switch unit, and the second switch unit, so that the analysis signal that is present at and can be tapped off from the connection site of the first switch unit and the second switch unit corresponds essentially to half the operational voltage. With values of the reference impedance deviating from one another, on the one hand, and values of the impedance of the measuring condenser deviating from one another, on the other hand, voltages that deviate by half the operational voltage are adjusted at the connecting point of the first switch unit and the second switch unit. As a result, the reference impedance can be adjusted, and the voltage divider that is formed from the first switch unit and the second switch unit can always be adjusted so that the analysis signal corresponds to half the operational voltage. This provides the advantage that the first switch unit and the second switch unit can always be operated symmetrically, such that comparable ratios are present in the first switch unit and the second switch unit.

In another advantageous configuration of the invention, it is provided that the alternating signal source can be switched on and off and/or the connection between the alternating signal source and the current supply network can be interrupted and restored. This is converted by, e.g., a switch, in particular by a semiconductor-multiplexer. By this measure, it is possible to configure the capacitive sensor in such a way that only at times—in particular periodically—does the alternating signal from the alternating signal source strike the current supply network.

Capacitive sensors with very low power consumption can be produced by the interrupted operation of the alternating signal source or the current supply network and analysis unit. The alternating signal source can be simply switched on and off, for example, by the alternating signal source being separated by an—electronic—switch from the operational voltage supply thereof. Other alternating signal sources have available an extra control input that is provided for this purpose and that also can be used in a corresponding way.

A build-up time that accompanies the switching process and that the alternating signal source needs to prepare the desired output signal is a problem that may arise when the supply voltage of the alternating signal source is switched on and off. This problem can be avoided by the connection between the alternating signal source and the current supply network being designed so that it can be interrupted and restored, for example via a switch. Also, here, the power consumption of the capacitive sensor is reduced relative to such a sensor without interrupting the alternating signal line, since the switching parts, which are fed by the alternating signal source—current supply network and optionally analysis unit—at the times of deficient alternating signals, have a considerably reduced power consumption relative to the actuated state.

In another configuration of the invention, it is provided that a holding element is arranged at the connecting point between the first switch unit and the second switch unit, whereby the holding element in particular is designed in such a way that it holds the analysis signal at the connecting point, whereby the holding element is preferably a holding condenser.

As a result, it is possible in addition to perform all functions to be performed on the analysis unit and all functions based on the analysis signal, even when an alternating signal from the alternating signal source does not strike the current supply network. This configuration is of special importance when the first switch unit and the second switch unit are designed as complementary emitter follower circuits or complementary source follower circuits, whereby the emitter follower circuits then are operated in particular without biasing voltage or the complementary source follower circuits are operated in particular without quiescent current. In this case, the current supply network has high impedance when there is no triggering by the alternating signal source, in particular between the operational voltage connections of the first switch unit and the second switch unit, so that the hold element can be produced in particular also as a hold condenser, since a discharging of the hold condenser takes place only very slowly via the very high-impedance first switch unit or second switch unit.

The configuration of the capacitive sensor according to the invention is also very advantageous for the following reason. It is immediately evident that the level of the currents flowing into the paths of the current supply network is not only dependent on the value of the reference impedance or the capacitance of the reference condenser and the measuring condenser, but rather the level of the current is also directly dependent on the frequency and the amplitude of the alternating signal that arrives at the capacitive sensor. This is substantiated in the frequency dependency of the reactance and the amplitude dependency of the current by a reactance of the voltage that is right next to the reactance.

If the alternating signal produced by the alternating signal source is subject to a change in frequency or a change in amplitude, this has an effect on the level of the currents, which are exchanged with the analysis unit via the current paths of the current supply network known from the prior art. Consequently, the differential signal, which is formed in the prior art in the analysis unit from the two currents, is also dependent on a change in the alternating signal in the frequency and/or in the amplitude. Since the comparison or threshold voltage within the analysis unit absolutely must not change in a corresponding way, however—this actually is even completely unlikely since there is no linkage with the alternating signal source—the reliability of the result, which yields the capacitive sensor known from the prior art, is dependent on a consistent alternating signal, whereby "consistent" refers to the constancy of the alternating signal in the frequency and in the amplitude.

In the capacitive sensor according to the invention, such a dependency of the measuring result on the alternating signal produced by the alternating signal source is no longer present. Since the adjustment of the threshold value takes place directly in the measuring condenser and an alternating signal that is variable in the frequency and in the amplitude has an effect both on the reference impedance or the reference condenser and on the measuring condenser, a state of influence defined by the tuning of the reference impedance or the reference condenser is still recognized, essentially independently of the frequency and amplitude resistance of the alternating signal.

According to an advantageous configuration of the invention, the reference impedance can be switched via a switch, specifically such that only defined parts of the currents flowing over the output of the first switch unit are available for the charging or discharging of the switched reference impedance. This measure makes it possible to control the value of the switched reference impedance or the capacitance of the switched reference condenser all the way from zero—switch is continuously open—up to the nominal value of the reference impedance or the nominal capacitance of the reference condenser—switch is continuously closed. The reference impedance or the reference condenser can be switched in particular in that the connection of the second electrode of the reference impedance or the reference condenser is switched with the reference potential or the connection of the first electrode of the reference impedance or the reference condenser is switched with the output of the first switch unit.

The adjustment of the impedance or capacitance intermediate values is achieved more precisely, in another preferred embodiment, in that the switch can be actuated and is actuated via a pulse-width-modulated signal. It is especially advantageous when the pulse-width-modulated signal for switching the switch has a frequency above the frequency of the alternating signal from the alternating signal source, since corresponding currents from each area of the oscillation contribute to the charge of the switched reference condenser or the switched portion of the reference condenser. In the case of high or very high measuring frequencies—for example, in alternating signal frequencies in the range of 150 MHz—it is more advantageous, however, when the pulse-width-modulated signal for switching the switch has a frequency below the frequency of the alternating signal from the alternating signal source, since this imposes less stringent requirements on the scanning and on average is equally effective in any area of the oscillation.

As an alternative to the conversion of the tunable reference condenser by means of a switch, a capacitance diode is used as a reference condenser in another preferred embodiment of the capacitive sensor, and said capacitance diodes are also referred to as varicaps or varactors, which, however, generally require a high control voltage, for example, control voltages of a few tens of volts, which are not available in common digital switches and therefore must first be produced. In contrast, the previously presented solution of the tunable reference condenser with a switch that is actuated by a pulse-width-modulated signal is therefore also advantageous, since to produce the pulse-width-modulated signal to actuate the switch directly, the starting signal of a microcontroller port can be used without the signal requiring amplification.

In an advantageous configuration of the invention, the alternating signal source is connected via a coupling condenser in terms of alternating current to the input of the first switch unit and via another coupling condenser to the input of the second switch unit.

Within the scope of the invention, it has been found that with use of the capacitive sensor according to the invention, a differentiation between an only slight adhesion of a medium to the sensor and the surrounding area of the sensor with a large volume of the medium—application fill-level measurement—is all the more possible the higher the frequency of the electrical alternating field that is emitted by the measuring condenser. This may have to do with the frequency dependency of the dielectric polarization and with the reduction of the contribution of the orientation polarization to the dielectricity of a medium at very high frequencies. To this end, however, frequencies of the alternating signal are necessary that lie far above the working frequency of 2 MHz of the electrical alternating signal source, which are common in the known sensors on which the invention is based.

According to another advantageous configuration of the teaching of the invention, the frequency of the alternating signal source and thus the frequency of the alternating signals produced by the alternating signal source—in a desired range—can be preset. This is therefore advantageous since the capacitive sensor, by the selection and the presetting of a suitable frequency of the alternating signal, can be optimally matched to the physical properties of the medium to be detected—in particular, at fill-level measurements. This property can be converted especially advantageously when the alternating signal source is embodied as a controlled oscillator, such as, e.g., as a voltage-, current- or resistance-controlled oscillator or else as a digital oscillator.

In another preferred embodiment of the second teaching of the invention, the alternating signal source produces alternating signals at a frequency of more than 10 MHz, whereby, in particular, frequencies of more than 100 MHz are used, preferably a frequency of essentially 150 MHz. Frequencies within ISM bands, which are released for industrial, scientific and medical applications, can also be used advantageously. In this connection, in particular, the frequency range of 433.05 MHz to 434.79 MHz is suitable, since here these are frequencies that are still easily assimilated in terms of circuit engineering and frequencies of this order of magnitude are especially suitable, since at these frequencies of the alternating signal and the emitted electrical alternating field, the above-described problem is not associated with the adhesion of the medium to the capacitive sensor.

In an especially preferred embodiment of the capacitive sensor, as already indicated several times, the reference impedance is designed as a reference condenser, whereby the reference condenser consists in particular of a first, non-tunable reference condenser and a second, tunable reference condenser, whereby it is especially advantageous to switch in parallel the first, non-tunable reference condenser and the second, tunable reference condenser. In this arrangement, the capacitance of the entire reference condenser can be controlled by a minimum capacitance, which corresponds to the nominal capacitance of the non-tunable reference condenser—switch is continuously open—up to a maximum capacitance, which is produced from the sum of the nominal capacitance of the first, non-tunable reference condenser and the nominal capacitance of the second, tunable reference condenser. By appropriately switching the second, tunable reference condenser in and out, each capacitance value between these two values can be set.

In another advantageous configuration of the teaching of the invention, it is provided that the reference impedance is produced by at least one semiconductor component, whereby the semiconductor component is actuated in particular by a pulse-width-modulated signal that is produced by a control device, whereby the pulse-width-modulated signal is filtered in particular through a low pass. If the issue is that the reference impedance is produced by at least one semiconductor component, then this obviously also comprises a switch that comprises a semiconductor component, whereby the semiconductor component then contributes decisively to the production of the active impedance; this is especially the case if the corresponding charge and discharge currents from the current supply network flow via the semiconductor component.

A special advantage when using a semiconductor component is the—basically achievable in any case—high-frequency capacity and the associated precise, high-frequency ability to trigger a reference impedance. Digital potentiometers that are known in the art usually have only a bandwidth of a few 100 kHz at a resistance in a range of several 10 k$\Omega$ up to several 100 k$\Omega$. Thus, the known digital potentiometers for the application that is advantageous here are not suitable, since the reference impedance should be in particular less than 100$\Omega$ in many switch variants according to the invention.

It has also proven advantageous when a transistor, in particular, a bipolar transistor in an emitter follower circuit or a junction field effect transistor (JFET), is used as a semiconductor component. Also advantageous is the use of a photoconductive cell or an optical coupler. Preferably, a control electrode of the semiconductor component is triggered via the—in particular low-pass-filtered—pulse-width-modulated signal.

If "a control electrode" of the semiconductor component is the item in question, then the base electrode of the transistor is meant in the case of the bipolar transistor in the emitter follower circuit and the gateway electrode is meant in the case of a JFET. In the case of the photoconductive cell, the control electrode is not an electrode in the objective, circuit-related sense of the term, but rather the area of the photoconductive cell that can be influenced by means of suitable electromagnetic radiation, and in the case of the optical coupler, the control electrode consists of the connections of the phototransmitter.

In an especially preferred embodiment of the invention, the control device detects the current that flows through the semiconductor component, determines the impedance of the semiconductor component from the detected current and adjusts the value of the reference impedance—i.e., the semiconductor component—by suitable triggering of the semiconductor component in a specified impedance value. This measure makes it possible to create a loop overall.

In another preferred configuration of the invention, a control device tunes the reference impedance, such that the value of the reference impedance essentially follows the value of the impedance of the measuring condenser, in particular by the charge and discharge currents of the reference impedance and the measuring condenser being compensated for or by the voltage value of the analysis signal corresponding essentially to half the operational voltage of the voltage divider. This has the result that the current supply network on average is always in equilibrium—i.e., is operated symmetrically—even when the alternating signal source is operated with variable frequency ("Wobbel generator," sweeping).

In another advantageous configuration of the capacitive sensor according to the invention, the measuring condenser is connected via an electrical line to the current supply network in such a way that the electrical line and the measuring condenser form a resonator, whereby the electrical line is in particular a coaxial line and/or whereby the resonator in particular is a $\lambda/4$ resonator. By this measure, in particular by the use of a coaxial line, resonance frequencies up to the megahertz and gigahertz range can be achieved in a simple way, whereby in this frequency range, the differentiation between an only slight adhesion of a medium to the sensor and the surrounding area of the sensor with a large volume of the medium—as described above—is especially very possible.

The resonance frequency of the arrangement that consists of an electrical line—coaxial line—and measuring condenser depends on, i.a., the length of the electrical line, whereby the resonance frequency is all the higher the shorter the electrical line. To influence the resonance frequency of the resonator, a coil is provided in the electrical line in another configuration of the invention, whereby the resonance frequency of the resonator is reduced in particular by the inductivity of the coil; the inductivity of the coil "extends" the electrical line by electrical means, as it were. As a result, the resonance frequency of the resonator can be adjusted in particular also to frequencies in the range of 150 MHz, so that medium adhesions of larger medium volumes can be distinguished.

In another advantageous configuration of the invention, the analysis unit and/or the control device is/are equipped such that the impedance of the measuring condenser can be analyzed by measuring the resonance frequency of the resonator and the current that flows in the case of resonance. This specifically refers here to impedance, since a real measuring condenser has not only capacitive properties, but as a whole manifests itself as impedance. By measuring the resonance frequency of the resonator and the current that flows in the case of resonance, not only the impedance of the measuring condenser but also the impedance of the resonator can be analyzed when the measuring condenser and a suitably designed electrical line as a whole form a resonator.

In another configuration, the analysis unit and/or the control device are configured in such a way that the impedance of the measuring condenser is determined by the resonator being operated at any frequency but essentially at a fixed, selected frequency, and the current that is detected in the influenced state of the measuring condenser being compared to the current that is detected in the uninfluenced state of the measuring condenser. In another configuration of the invention, the level of the detected current and/or the level of the calculated current difference is used as a switch criterion, e.g., in a capacitive sensor that is configured as a proximity switch.

An advantageous configuration of the capacitive sensor according to the invention is distinguished in that the alternating signal source and/or the analysis unit and/or the control device is/are configured such that the resonance frequency of the resonator can be determined, and the measured resonance frequency of the resonator is compared to the specified or determined resonance frequency of the resonator in the uninfluenced state of the capacitive sensor, whereby in particular the difference of the resonance frequency of the resonator can be analyzed. In this embodiment, due consideration is paid to the fact that the resonance frequency of the resonator changes with changing external influence of the resonator or the measuring condenser. If, for example, a specific difference of the resonance frequency is reached, a switching process can be triggered in a capacitive sensor that is designed as a proximity switch.

In particular, there are now various possibilities to configure and to further develop the capacitive sensors according to the invention. To this end, the claims subordinate to Claim 1 and the description of preferred embodiments in connection with the drawing are pointed out. In the drawing:

BRIEF DESCRIPTION OF THE DRAWINGS

FIG. 5 shows a preferred embodiment of the tunable reference condenser of the capacitive sensor according to FIG. 2, FIGS. 6a & 6b show additional embodiments of tunable reference condensers for capacitive sensors according to the invention.

DETAILED DESCRIPTION OF THE INVENTION

Figure 1:
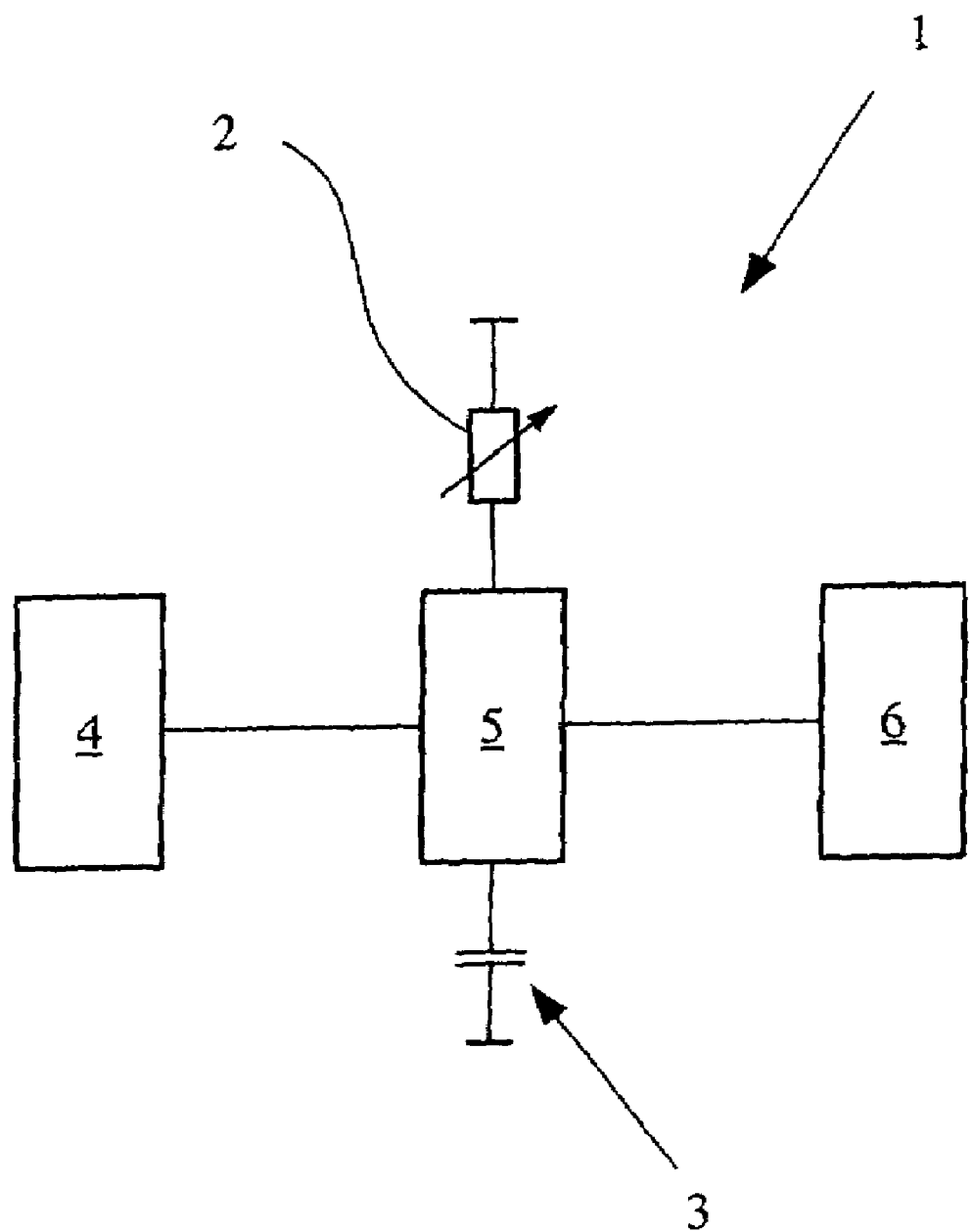
FIG. 1 is a diagrammatic view of a first embodiment of a capacitive sensor according to the invention with a tunable reference condenser.

FIG. 1 shows a first embodiment of a capacitive sensor 1 with a reference impedance 2 and a measuring condenser 3, at least one electrical alternating signal source 4, and a current supply network 5 as well as with an analysis unit 6. The reference impedance 2 and the measuring condenser 3 are connected, via the current supply network 5, with the alternating signal source 4 and the analysis unit 6 in such a way that the charge and discharge currents of the reference impedance 2 and the measuring condenser 3 and/or an analysis signal from the analysis unit 6 that characterizes the charge and discharge currents of the reference impedance 2 and the measuring condenser 3 can be analyzed, whereby the reference impedance 2 can be tuned. By the ability of the reference impedance 2 to be tuned, the value of the reference impedance in each desired state of influence of the capacitive sensor can be adjusted to the impedance or capacitance of the measuring condenser that is dependent on the state of influence. Because of the ability to make adjustments in the area of the actual capacitive sensor, no ability to make adjustments or to set a zero point within the analysis unit is needed, which enormously simplifies the switching.

In FIGS. 1 to 3 and 10 to 11, the measuring condenser 3 is always shown with the graphic symbol that is common for a condenser—in terms of an electrical component. Actually, in the case of the applications that are common for a capacitive sensor, the second electrode of the measuring condenser 3 is formed by the surrounding area of the capacitive sensor, and the capacitance is formed between the first electrode of the measuring condenser 3 and the surrounding area of this active electrode of the measuring condenser 3.

Figure 2:
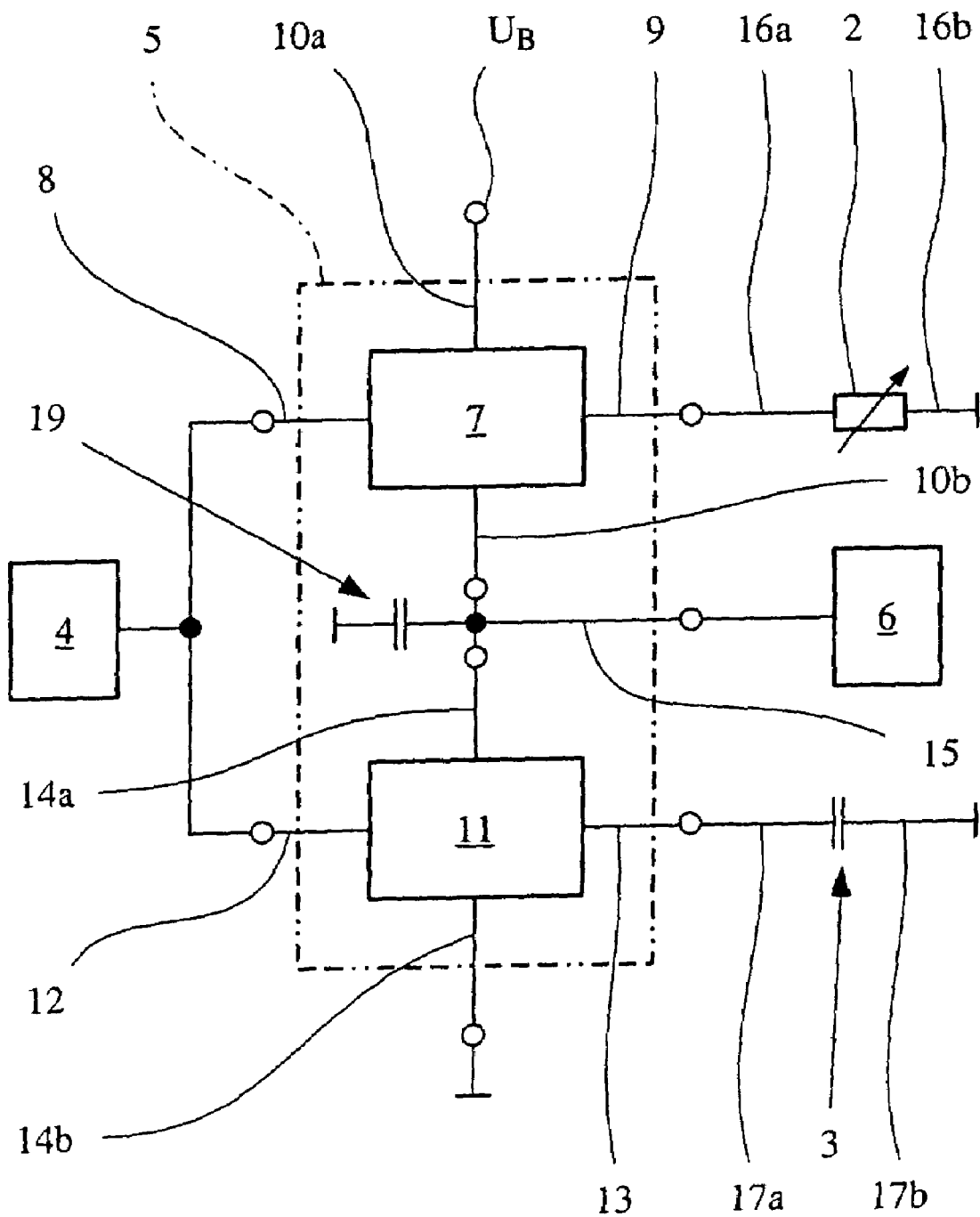
FIG. 2 shows another embodiment of a capacitive sensor according to the invention with a first switch unit and a second switch unit.

In the embodiment according to FIG. 2, the current supply network 5 comprises a first switch unit 7 with a high-impedance input 8, with a low-impedance output 9, and with two operational voltage connections 10a, 10b as well as a second switch unit 11 with a high-impedance input 12, with a low-impedance output 13 and with two operational voltage connections 14a, 14b. The first switch unit 7 and the second switch unit 11 are connected to one another at a connecting point 15 via a respective operational voltage connection 10b, 14a and form a voltage divider of an essentially constant operational voltage $U_B$. The alternating signal from the alternating signal source 4 strikes the input 8 of the first switch unit 7 and the input 12 of the second switch unit 11, whereby the output 9 of the first switch unit 7 is connected to the first electrode 16a of the tunable reference impedance 2, and the second electrode 16b of the reference impedance 2 is connected to a reference potential. The output 13 of the second switch unit 11 is connected to the first electrode 17a of the measuring condenser 3. The analysis signal that characterizes the charge and discharge currents of the reference impedance 2 and the measuring condenser 3 can then be tapped off at the connecting point 15 from the analysis unit 6. The alternating signal source 4 receives virtually no impact from the high-impedance inputs 8, 12 of the first switch unit 7 and the second switch unit 11.

Based on the action of the current supply network 5 configured as a voltage divider, already explained in detail above, the reference impedance 2 and the measuring condenser 3 are produced from the charge and discharge currents. If the reference impedance 2 and the measuring condenser 3 have the same impedance values, the same charge and discharge currents and thus the same impedances of the first switch unit 7 and the second switch unit 11—assuming the same design of the first switch unit 7 and the second switch unit 11, which is the case here—are produced, from which an analysis signal at the level of half the operational voltage results. At different values of the reference impedance 2 and the measuring condenser 3, charge and discharge currents of varying size result in the first switch unit 7 and the second switch unit 11, and thus, the voltage divider in this case is unsymmetrical, and the analysis signal deviates by half the operational voltage.

By analyzing the analysis signal, it can thus be determined whether the measuring condenser 3 has reached a specific impedance or not relative to the reference impedance 2. The capacitance of the measuring condenser 3 usually is varied in this case by an object approaching the active electrode of the measuring condenser 3 or by a change in the material of the surrounding area of the active electrode of the measuring condenser 3 by means of a medium that is to be detected (fill-level measurement).

The embodiments of capacitive sensors 1 according to the invention, shown in the figures, are distinguished in that the reference condenser 2 can be tuned, and its impedance thus can be adjusted. As a result, the reference condenser 2 can be tuned; the zero point adjustment that is known from the prior art presetting of a threshold value—had been moved from the analysis unit 6 into the actual sensor area. Apart from the fact that the analysis unit 6 is now configured significantly more simply in terms of circuit engineering and is therefore also can be manufactured significantly more advantageously, the embodiments that are shown also have considerable advantages with respect to the dependency of the measuring result on the stability and quality of the alternating signal, which is fed from the alternating signal source 4 into the current supply network 5. The advantage is substantiated in that the reference impedance 2, in the desired state of influence of the measuring condenser 3, is tuned to the capacitance of the measuring condenser 3. As a result, in the state of influence of the measuring condenser 3 that is to be detected, a symmetrical, balanced voltage divider is produced, and this occurs regardless of whether the alternating signal produced by the electrical alternating signal source 4 is variable in frequency and in amplitude.

Figure 3:
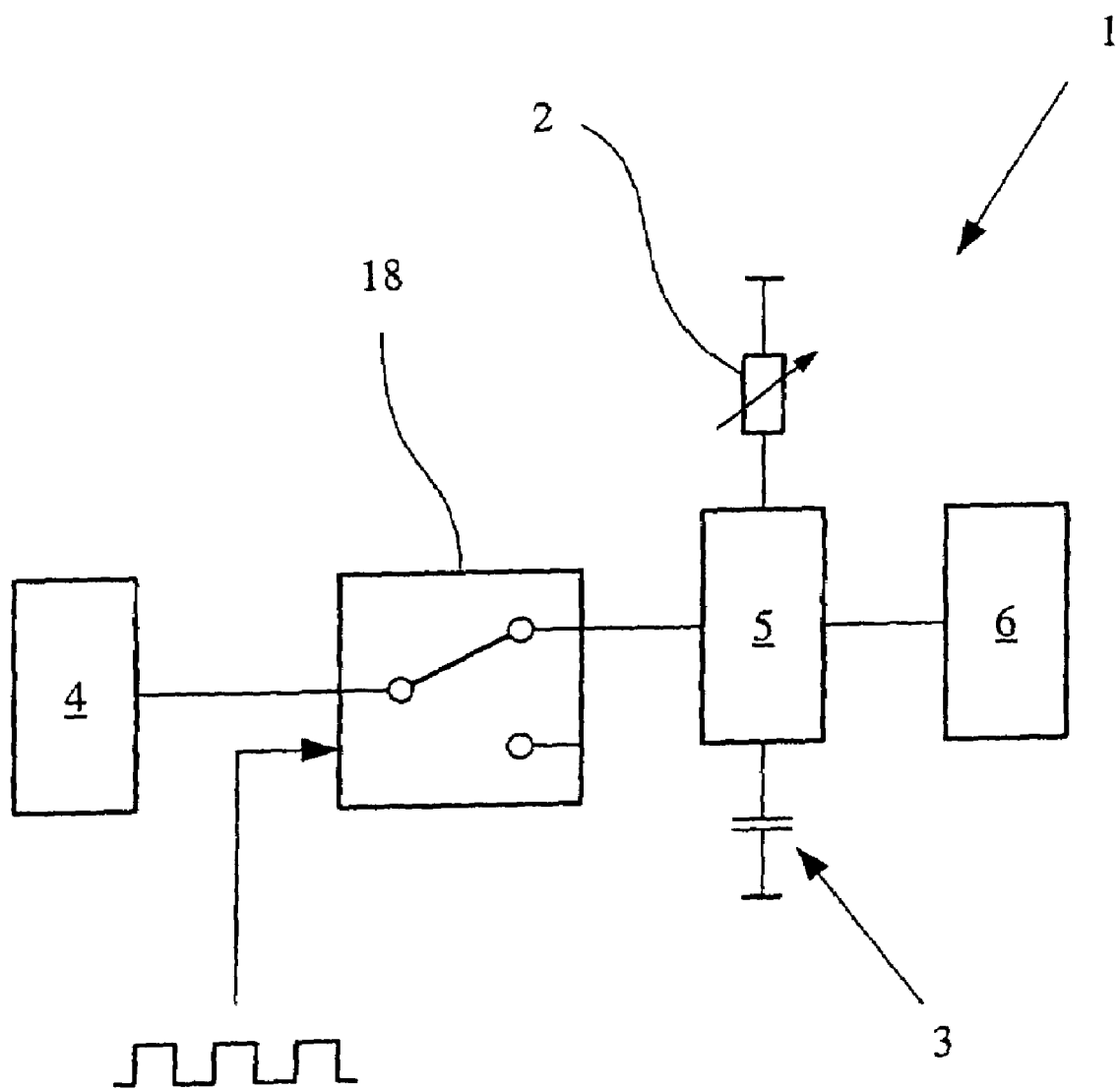
FIG. 3 is a diagrammatic view of a preferred embodiment of the capacitive sensor according to the invention with a connection between alternating signal source and current supply network that can be interrupted.

In the embodiment according to FIG. 3, the connection between the alternating signal source 4 and the current supply network 5 can be interrupted and restored, namely by a semiconductor-multiplexer 18. As a whole, the capacitive sensor 1 that is shown is configured in such a way that only at times does the alternating signal from the alternating signal source 4 strike the current supply network 5 so that the power consumption of the capacitive sensor 1 that is shown in FIG. 3 is lower relative to a continuously-operated capacitive sensor. In this connection, it has proven useful to arrange a holding element at the connecting point 15 between the first switch unit 7 and the second switch unit 11, whereby the holding element is designed in such a way that it holds the analysis signal at the connecting point 15. This is shown in FIG. 4, whereby the holding element is produced here as holding condenser 19.

Figure 4:
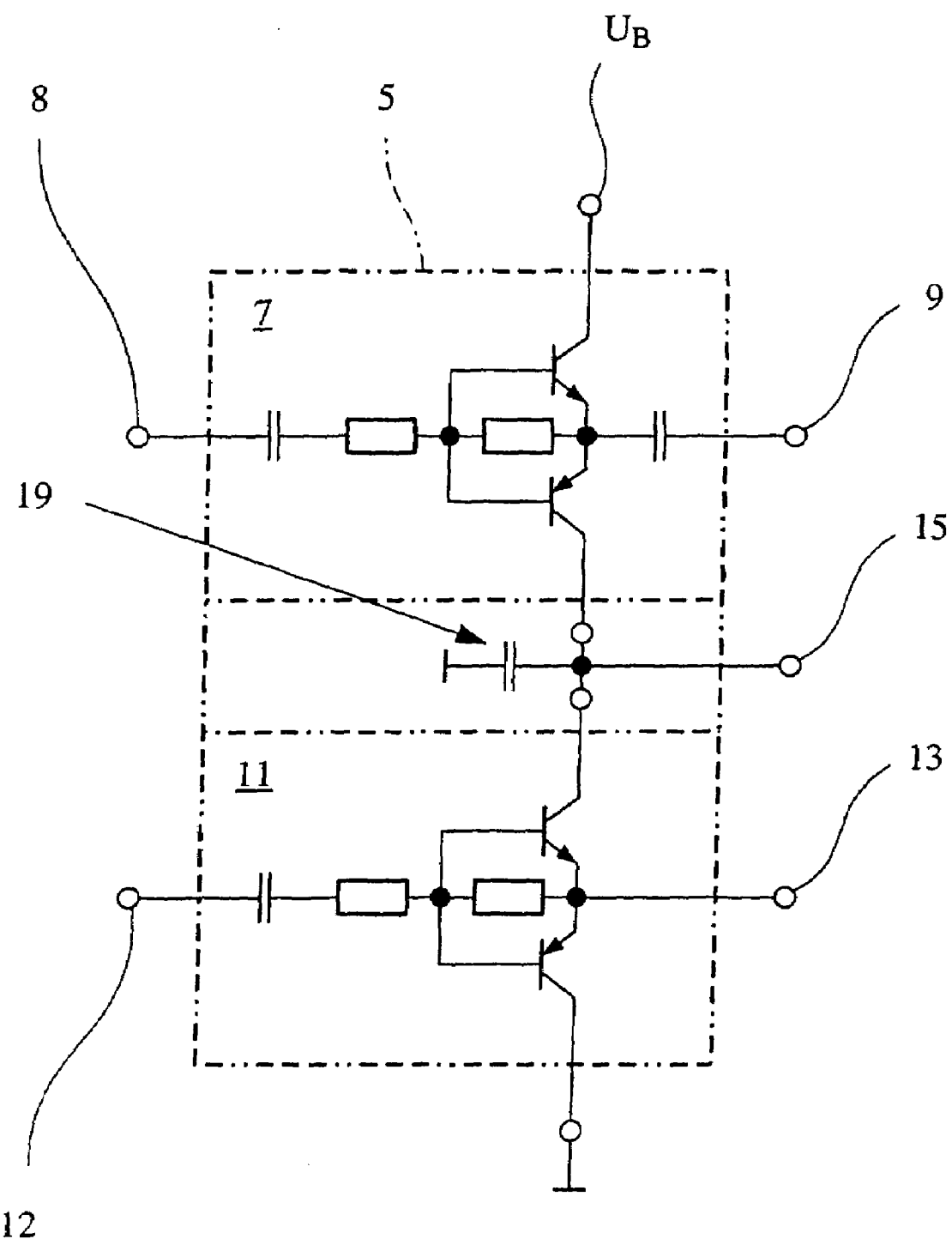
FIG. 4 shows a preferred embodiment of the capacitive sensor according to the invention with emitter follower circuits as first and second switch units.

It can also be seen in FIG. 4 that the first switch unit 7 and the second switch unit 11 are designed as complementary emitter follower circuits without biasing voltage, whereby the inputs 8, 12 of the first switch unit 7 and the second switch unit 11 have high impedance and the outputs 9, 13 of the first switch unit 7 and the second switch unit 11 have low impedance. As a result of the biasing voltage of the emitter follower circuits having been eliminated, the emitter follower circuits have high impedance as soon as the inputs 8, 12 are no longer actuated. This means, however, that the charge found in the holding condenser 19 cannot flow out over the first switch unit 7 and the second switch unit 11 such that the analysis signal persists over an extended period, assuming that the connecting point 15 is also charged with high impedance. By this measure, an analysis signal is also present when the inputs 8, 12 of the first switch unit 7 and the second switch unit 11 are not actuated.

In the embodiments according to FIGS. 5 and 6, the reference impedance 2 is shown in each case as a reference condenser. In the embodiment according to FIG. 5, the tunability of the reference condenser 2 is achieved in that the reference condenser 2 can be switched via a switch 20. In the embodiment that is shown in this case, the second electrode 16*b* of the reference condenser 2 is connected to the reference potential 21 or separated from the reference potential 21 by the switch 20. As a result, it is ensured that the reference condenser 2 can be charged only at the times in which the switch 20 has produced a connection with the reference potential 21. If the switch 20 is to be closed only temporarily at the times at which the reference condenser 2 could theoretically be charged or discharged based on the voltage that is present at the output 9 of the first switch unit 7, the reference condenser 2 will also be only partially charged, such that such a reference condenser 2 is simulated, which has a smaller capacitance that the actual nominal capacitance of the reference condenser 2. With the switch indicated in FIG. 5, capacitances of the reference condenser 2, which lie between the zero capacitance and the nominal capacitance of the reference condenser 2, can thus be set.

In FIGS. 6*a* & 6*b*, in each case, another embodiment represents a tunable reference condenser 2. FIG. 6*a* shows that the reference condenser 2 formed of a first, non-tunable reference condenser 22*a* and a second, tunable reference condenser 22*b*, whereby the first, non-tunable reference condenser 22*a* and the second, tunable reference condenser 22*b* are switched in parallel. The capacitance of this arrangement can accordingly be set between the nominal capacitance of the first, non-tunable reference condenser 22*a* and the sum of the nominal capacitances of the first, non-tunable reference condenser 22*a* and the second, tunable reference condenser 22*b*. FIG. 6*b* shows the production of the tunable reference condenser 22*b* via a switch 20, which is arranged between the second, tunable reference condenser 22*b* and the reference potential 21.

Within the scope of the invention, it has been found that the capacitive sensors, known from the prior art, with a working frequency in the range of about 2 MHz are virtually unsuitable to produce a reliable fill-level measurement. This relates to the fact that, at such frequencies, it is often not possible to distinguish, by means of instruments, whether the capacitive sensor is surrounded by a large volume of the medium to be detected or whether the sensor is affected only by a small amount of adhesion that has been left on the sensor after the fill level has dropped below the position of the capacitive sensor. As has been found according to the invention, the two above-described situations are distinguishable when the operation is performed with significantly higher frequencies of the alternating signal.

In the embodiments shown, the alternating signal source 4 is configured such that the frequency of the alternating signals—in a desired range—can be preset. In the embodiments shown, the alternating signal source 4 is embodied as a voltage-controlled oscillator. By the variability of the frequency of the alternating signals, the capacitive sensor 1 that is shown can easily be matched to the physical properties of various media, which is advantageous in particular for the purpose of the fill-level measurement and in connection with the above-described problems with residual adhesions remaining at the sensor 1.

In the embodiments that are shown, the alternating signal source 4 is set in such a way that it produces alternating signals at a frequency of 434 MHz. In this case, this is a frequency within a released ISM Band (Industrial, Scientific and Medical Band). In addition to the advantage that frequencies within such an ISM Band must be used license-free, there is another advantage of the selected frequency in that the frequency is so high that the above-described "residual adhesion problem" no longer occurs in most media that are to be detected by means of instruments. In other embodiments that are not shown here, an alternating signal frequency in the range of 150 MHz is used, in which the residual adhesions can be very easily distinguished from full-volume sensor environments.

Figure 7:
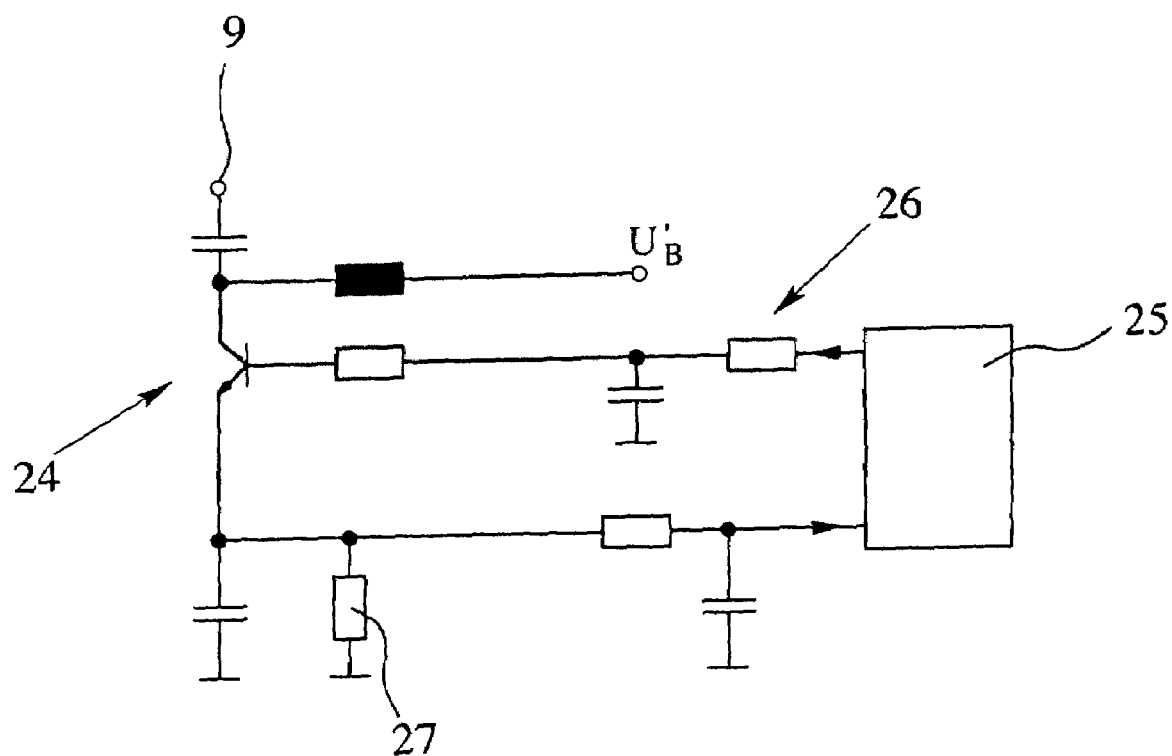
FIG. 7 shows the production of the reference impedance with a transistor as a semiconductor component.
Figure 8:
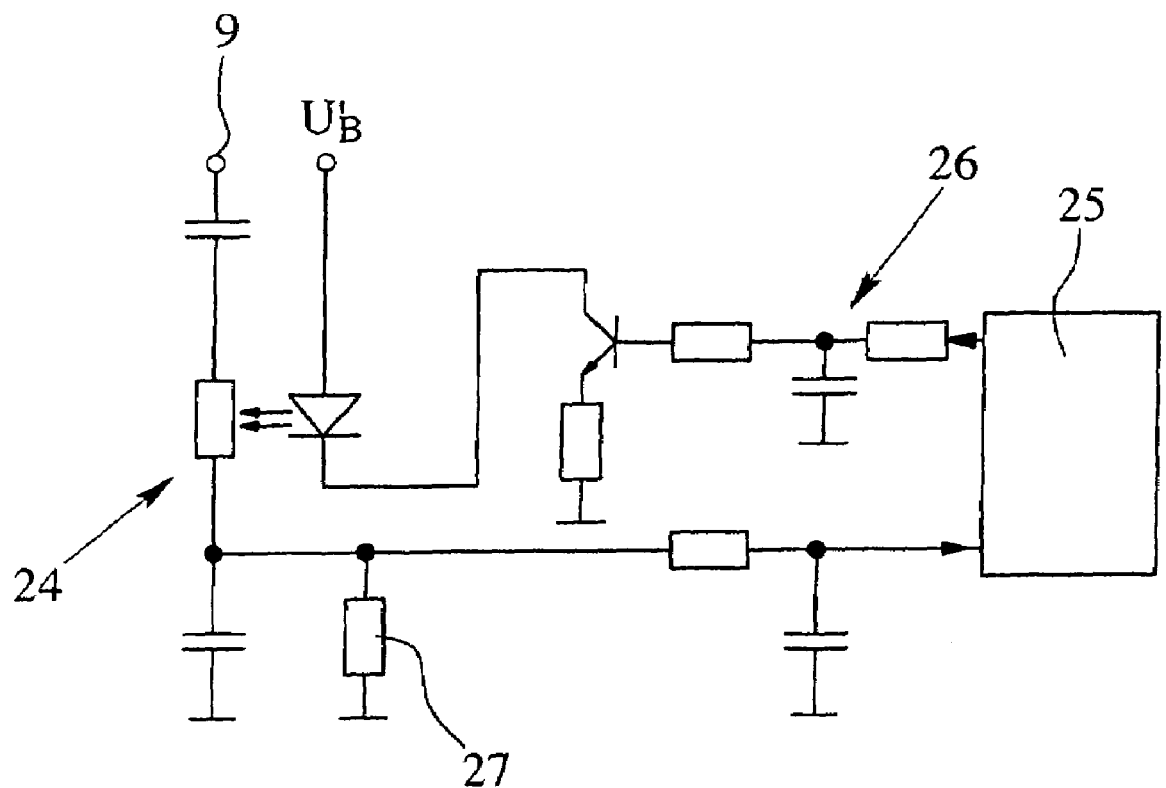
FIG. 8 shows the production of the reference impedance with a photodiode or an optical coupler as a semiconductor component.
Figure 9:
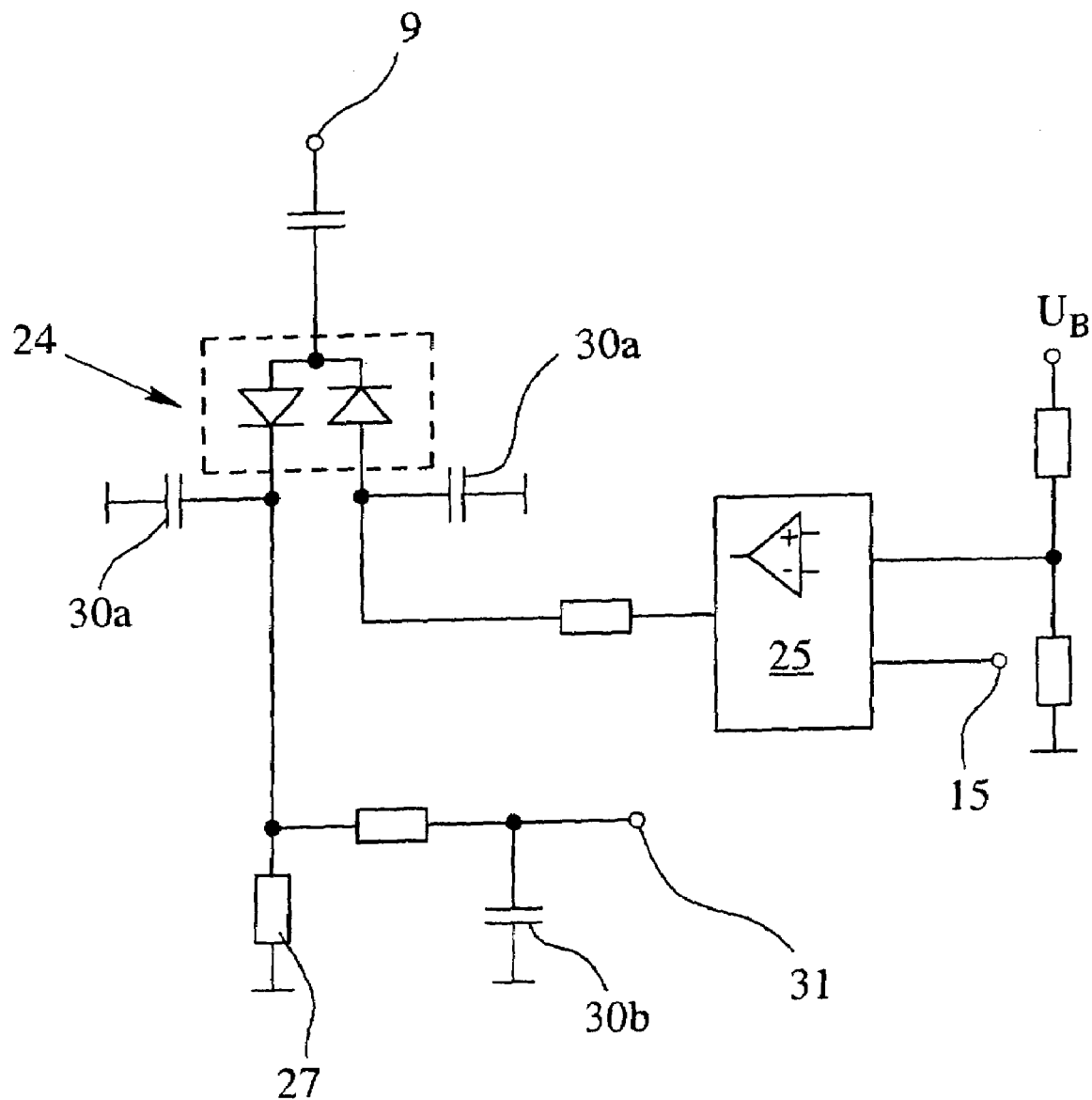
FIG. 9 shows the production of the reference impedance with a double diode as a semiconductor component.

In FIGS. 7, 8 and 9, three embodiments are shown in which the reference impedance 2 is produced by a switch that, in each case, has a semiconductor component 24. For reasons of clarity, the residual circuit is not shown, but in each case it is embodied as shown in, e.g., FIGS. 1 to 4.

In the embodiments of FIGS. 7 and 8, the semiconductor component 24 is triggered by a pulse-width-modulated signal that is produced by a control device 25, whereby the pulse-width-modulated signal is filtered by a low pass filter 26 before it reaches the semiconductor component 24 directly or indirectly. The low pass filter 26 has the effect of smoothing the pulse-width-modulated signal, whereby present at the output of the low pass filter 26—assuming a pulse-width-modulated signal with an invariant pulse duty factor—an essentially constant signal exists to trigger the semiconductor component 24, whose level depends only on the pulse duty factor of the pulse-width-modulated signal.

In FIG. 7, the semiconductor component 24 is a bipolar npn transistor, and in FIG. 8, the semiconductor component 24 is a photoconductive cell or, if the LED that is shown and the photoconductive cell are present in the subassembly, an optical coupler. In both cases, the control electrodes of the semiconductor component 24 are triggered via the pulse-width-modulated signal of the control device 25, indirectly via the low pass 26.

In the embodiments according to FIGS. 7 and 8, in each case, the semiconductor component 24 is connected via a coil to an operating voltage $U'_B$ such that, as a whole, the working point, and thus, the impedance of the semiconductor component 24, can be set in the current path between the output 9 of the first switch unit 7 and the ground. The coil blocks high-frequency signals, originating from the output 9 of the first switch unit, in the direction toward the supply voltage $U'_B$ such that the charge and discharge currents flow through the semiconductor component 24. It is indicated by $U'_B$ that this does not absolutely have to be the operational voltage of the current supply network $U_B$; however, this is possible.

In the embodiments according to FIGS. 7 and 8, the control device 25 detects the current that flows through the semiconductor component 24 and determines the impedance of the semiconductor component 24 using the detected current. As a result, it is possible for the control device 25 to adjust the impedance of the semiconductor component 24 to a preset impedance value by suitable actuation of the semiconductor component 24. The detection of the current that flows through the semiconductor component 24 is carried out by the current sensing resistor 27, at which there is a corresponding voltage drop. The voltage signal is filtered through another low pass filter in the embodiments shown, before it is detected by the control device 25. A control circuit is thus produced by the recycling of the voltage dropping via the current sensing resistor 27.

In the embodiments shown in FIGS. 7 to 9, the control device 25 adjusts—or the analysis unit 7 and the control device 25 determine—the value of the reference impedance 2—essentially produced by the semiconductor component 24—by the value of the reference impedance 2 being readjusted to the value of the impedance of the measuring condenser. In the embodiments shown, this is converted by the charge and discharge currents of the reference impedance 2 being adjusted so that they correspond to the charge and discharge currents of the measuring condenser 3, which is thus equivalent to the output signal present at the connecting point 15 corresponding to the value of half the operational voltage $U_B$.

To detect the charge and discharge currents or to detect the associated voltage of the analysis signal at the connecting point 15, the control device 25 is connected to the analysis unit 6, which is not expressly shown in FIGS. 7 to 9. In the embodiment according to FIG. 9, a double diode is used as a semiconductor component 24. On the one hand, the control device 25 obtains the analysis signal from the current supply network 5, and on the other hand, it obtains half the operational voltage from another indicated voltage divider. The control device 25 essentially consists of a differential amplifier, whose output signal—and thus the current through the double diode—is changed until the initial differential voltage is at zero, which is equivalent here to the same charge and discharge currents of the measuring capacitance 3 and the reference impedance 2, from which the value of the impedance of the measuring capacitance 3 can easily be derived.

The two diodes of the double diode in FIG. 9 are parallel in terms of alternating current via the two condensers 30a, which have a capacitance of 100 pF here, and are grounded. For low-frequency signals, the two diodes are connected in series, whereby the co-current that flows via the two diodes of the semiconductor component 24 flows out over the current sensing resistor 27 from the ground, and the voltage that drops at the current sensing resistor can be tapped off at connection 31; the condenser 30b smoothes the signal characterizing the current flow through the double diode and thus the working point of the double diode. The signal that is present at the connection 31 can then be further used by the analysis unit 6 or the control device 25, which is not shown in detail.

The fact that the analysis unit 6 and the control device 25 are shown separately as a whole is used here only for the purpose of clarity. Actually, the analysis unit 6 and the control device 25 can be produced in a circuit engineering unit, such as, e.g., a microcontroller, which has the result that the analysis unit 6 and the control device 25 are automatically "connected to one another."

Figure 10:
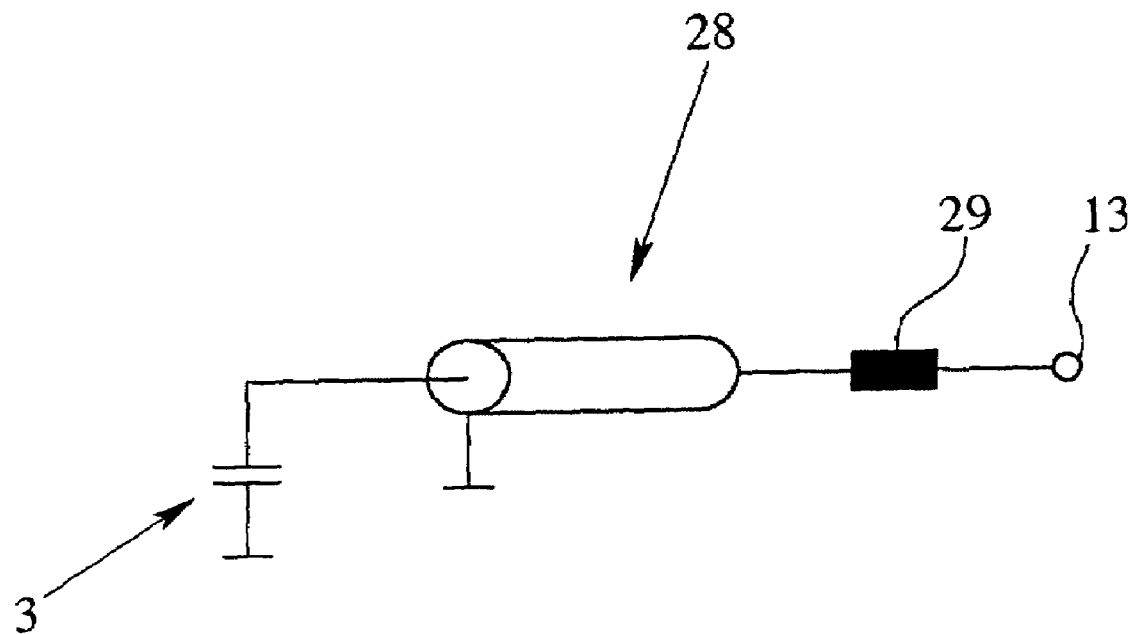
FIG. 10 shows an embodiment for the configuration of the measuring condenser with an electrical line to a resonator.

In FIG. 10, another embodiment of a capacitive sensor, in which, namely, the measuring condenser 3 is connected to the current supply network—indicated here only via the second connection 13 of the current supply network—via an electrical line 28, specifically so that the electrical line 28 and the measuring condenser 3 form a resonator, which electrically oscillates with suitable excitation, is shown in parts. In the embodiment shown, the electrical line 28 is a coaxial line, whereby the resonator to be produced is a λ/4 resonator, also known as a λ/4 line. Thus, in a simple way, resonance frequencies up to the gigahertz range can be achieved.

Since the resonance frequency of the resonator depends on, i.a., the length of the electrical line 28, i.e., the length of the coaxial line, design considerations limit the dimensions of the coaxial line, however, and the resonance frequency of the resonator is matched to the electrical path. In FIG. 10, a coil 29 is provided in the electrical line 28, whereby the resonance frequency of the resonator is reduced by the inductivity of the coil 29. In the embodiment depicted in FIG. 10, the resonance frequency of the resonator is about 150 megahertz, a frequency in which, with a medium, the presence of only slight adhesions on the sensor can be easily distinguished from a large-volume surrounding areas of the sensor.

In the embodiments of a capacitive sensor at least partially shown in FIGS. 7 and 8, the analysis unit 6 and the control device 25 are configured such that the impedance of the measuring condenser 3 can be determined by measuring the resonance frequency of the resonator and the current that flows in the case of resonance; to do this, the excitation frequency of the electrical alternating signal source 4 always passes through a relevant frequency range ("frequency wobbling," sweeping).

Figure 11:
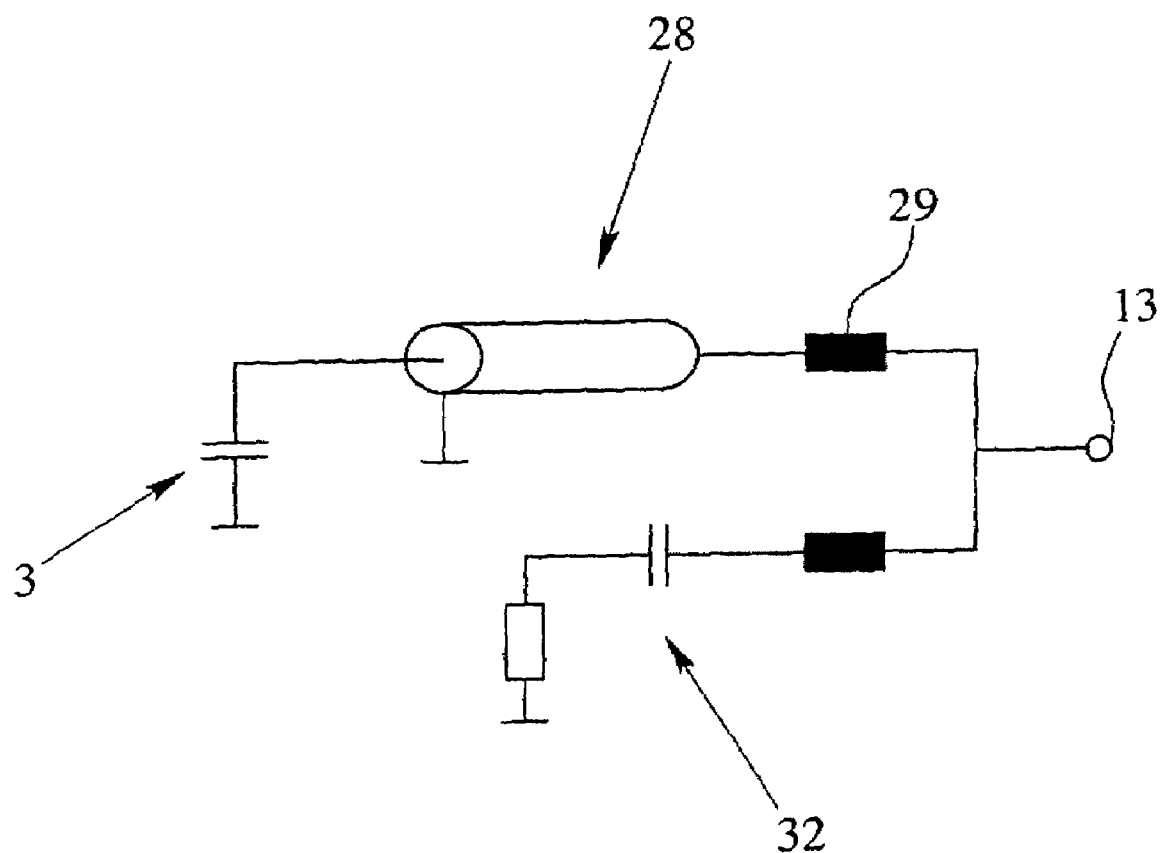
FIG. 11 shows an embodiment with a resonator according to FIG. 10 with an additional reference resonator.

In FIG. 11, in turn, only a portion of an embodiment of a capacitive sensor is shown, which is built up in the embodiment according to FIG. 10. Here, a reference resonator 32 is switched in parallel to the resonator, whereby the reference resonator 32 essentially cannot be influenced electrically from the outside, in particular, not by the medium that influences the resonator or the measuring capacitance 5 of the resonator. In addition, it is provided that the resonance frequency of the reference resonator 32 deviates from the resonance frequency of the resonator. This detuning of the two resonators is intended to be able to distinguish the resonators from one another in particular based on their contributions to a common frequency response.

The resonance frequency of the reference resonator 32 is preferably selected such that it lies outside the area of the resonance frequencies of the resonator that can be covered by different states of influence of the measuring capacitance 3. As a result, the resonance frequency of the resonator is reliably prevented from being mistaken for the resonance frequency of the reference resonator 32. If the reference resonator 32 preferably has essentially the same components as the resonator, in particular an essentially identical electrical line, then the reference resonator 32 represents, as it were, a parallel model of the resonator, in which changes can be observed that cannot have been caused by an external influence of the capacitive sensor.

As a whole, a capacitive sensor is equipped with a resonator and a reference resonator 32 instead of only one measuring capacitance so that the alternating signal source 4 and/or the analysis unit 6 and/or the control device 25 is/are configured such that the resonator and the reference resonator 32 can be excited in a suitable frequency range ("wobbling"), the amplitude response of the differential current and/or the differential voltage of the charge and discharge currents can be detected, namely by analysis of the amplitude response of the analysis signal, the resonance frequency of the reference resonator 32 can be determined, and the value of the resonance frequency of the reference resonator 32 that is detected can be compared to a preset value of the resonance frequency of the reference resonator 32, and a deviation of the two values indicates the existing property drift of the reference resonator 32 and the resonator. Property drift is defined as, for example, the change in component properties that change under the influence of temperature—temperature drift-however, for example, aging-induced changes of the previously depicted sensors can be detected. The knowledge on the property drift of the reference resonator 32 can be transferred to the resonators that can be influenced externally, such that property drifts can be taken into consideration in the analysis of collected measuring data and can be used for, e.g., temperature compensation.

What is claimed is:

1. Capacitive sensor, comprising:
a tunable reference impedance,
at least one measuring condenser,
at least one electrical alternating signal source,
a current supply network, and
an analysis unit;
wherein the reference impedance and the measuring condenser are connected via the current supply network to the alternating signal source and the analysis unit in such a way that charge and discharge currents of the reference impedance and at least one of the measuring condenser and an analysis signal from the analysis unit that characterizes the charge and discharge currents of the reference impedance and the measuring condenser can be analyzed, and wherein the alternating signal source is at least one of switchable on and off and switchably connectable and disconnectable with the current supply network.

2. Capacitive sensor according to claim 1, wherein the frequency of the alternating signals from the alternating signal source are presettable in a desired range by the alternating signal source being a controlled oscillator.

3. Capacitive sensor according to claim 1, wherein the alternating signal source produces alternating signals at a frequency of more than 10 MHz.

4. Capacitive sensor according to claim 1, wherein the measuring condenser is connected via an electrical line to the current supply network in a manner forming a resonator.

5. Capacitive sensor according to claim 4, wherein a coil is provided in the electrical line for influencing the resonance frequency of the resonator, whereby the resonance frequency of the resonator is reduced by the inductivity of the coil.

6. Capacitive sensor according to claim 4, wherein a reference resonator is switched in parallel to the resonator formed by the connection of the measuring condenser to the current supply network, wherein the reference resonator is essentially uninfluenced electrically from the outside, and wherein the resonance frequency of the reference resonator deviates from the resonance frequency of the resonator formed by the connection of the measuring condenser to the current supply network.

7. Capacitive sensor according to claim 6, wherein the reference impedance is triggered by a control device wherein at least one of the alternating signal source, the analysis unit and the control device is/are configured in a manner such that the resonator formed by the connection of the measuring condenser to the current supply network and the reference resonator are excited in a defined frequency range, the amplitude response of at least one of a differential current and a differential voltage of the charge and discharge currents are detectable by analysis of the amplitude response of the analysis signal, the resonance frequency of the reference resonator determined, and the value of the detected resonance frequency of the reference resonator compared to a preset value of the resonance frequency of the reference resonator, and a deviation of the values indicating an existing property drift of the reference resonator and the resonator formed by the connection of the measuring condenser to the current supply network.

8. Capacitive sensor, comprising:
a tunable reference impedance,
at least one measuring condenser,
at least one electrical alternating signal source,
a current supply network, and
an analysis unit;
wherein the reference impedance and the measuring condenser are connected via the current supply network to the alternating signal source and the analysis unit in such a way that charge and discharge currents of the reference impedance and at least one of the measuring condenser and an analysis signal from the analysis unit that characterizes the charge and discharge currents of the reference impedance and the measuring condenser can be analyzed, wherein the current supply network comprises at least a first switch unit with a high impedance input, a low impedance output, and two operational voltage connections as well as a second switch unit with a high impedance input, a low impedance output and two operational voltage connections, the first switch unit and the second switch unit being connected to one another at a connecting point via a respective operational voltage connection to form a voltage divider of an essentially constant operational voltage, wherein an alternating signal from the alternating signal source is delivered to the high impedance input of the first switch unit and the high impedance input of the second switch unit, wherein the low impedance output of the first switch unit is connected to a first electrode of the tunable reference impedance, and a second electrode of the tunable reference impedance is connected to a reference potential, wherein the output low impedance output of the second switch unit is connected to a first electrode of the measuring condenser, wherein the analysis signal that characterizes the charge and discharge currents of the reference impedance and the measuring condenser is obtainable from the connecting point by the analysis unit.

9. Capacitive sensor according to claim 8, wherein a holding element is arranged at the connecting point between the first switch unit and the second switch unit, and wherein the holding element is adapted to hold the analysis signal at the connecting point.

10. Capacitive sensor according to claim 8, wherein the first switch unit and the second switch unit are one of complementary emitter follower circuits and complementary source follower circuits.

11. Capacitive sensor, comprising:
a tunable reference impedance having first and second electrodes,
at least one measuring condenser,
at least one electrical alternating signal source,
a current supply network, and
an analysis unit;
wherein the reference impedance and the measuring condenser are connected via the current supply network to the alternating signal source and the analysis unit in such a way that charge and discharge currents of the reference impedance and at least one of the measuring condenser and an analysis signal from the analysis unit that characterizes the charge and discharge currents of the reference impedance and the measuring condenser can be analyzed,
further comprising a switch with which the reference impedance can be switched—at least partially—so that one of the connection of the second electrode of the reference impedance can be switched with the reference potential and the connection of the first electrode of the reference impedance can be switched with the output of said switch.

12. Capacitive sensor according to claim 11, wherein the switch is actuatable by a pulse-width-modulated signal, and the pulse-width-modulated signal has a frequency below the frequency of the alternating signals from the alternating signal source.

13. Capacitive sensor, comprising:
a tunable reference impedance,
at least one measuring condenser,
at least one electrical alternating signal source,
a current supply network, and
an analysis unit;
wherein the reference impedance and the measuring condenser are connected via the current supply network to the alternating signal source and the analysis unit in such a way that charge and discharge currents of the reference impedance and at least one of the measuring condenser and an analysis signal from the analysis unit that characterizes the charge and discharge currents of the reference impedance and the measuring condenser can be analyzed,
wherein the reference impedance is one of a reference condenser and a reference resistor, wherein said one of a reference condenser and reference resistor comprises a first, non-tunable one of a reference condenser and reference resistor and a second, tunable one of a reference condenser and reference resistor, that are switched in parallel.

14. Capacitive sensor, comprising:
a tunable reference impedance,
at least one measuring condenser,
at least one electrical alternating signal source,
a current supply network, and
an analysis unit;
wherein the reference impedance and the measuring condenser are connected via the current supply network to the alternating signal source and the analysis unit in such a way that charge and discharge currents of the reference impedance and at least one of the measuring condenser and an analysis signal from the analysis unit that characterizes the charge and discharge currents of the reference impedance and the measuring condenser can be analyzed,
wherein the reference impedance comprises at least one semiconductor component that is triggered by a signal that is pulse-width-modulated by a control device, and wherein the pulse-width-modulated signal is filtered via a low pass filter.

15. Capacitive sensor according to claim 14, wherein the semiconductor component is one of a bipolar transistor in an emitter follower circuit, a junction field effect transistor (JFET), a photoconductive cell, an optical coupler and a double diode, and wherein a control electrode of the semiconductor component is triggered by the low-pass-filtered, pulse-width-modulated signal.

16. Capacitive sensor according to claim 14, wherein the control device detects current that flows through the semiconductor component, determines the impedance of the semiconductor component from the detected current, and adjusts the impedance of the semiconductor component by triggering of the semiconductor component to a specified impedance value.

17. Capacitive sensor according to claim 14, wherein the control device tunes the reference impedance such that the value of the reference impedance follows the value of the impedance of the measuring condenser.

18. Capacitive sensor according to claim 14, wherein the measuring condenser forms a resonator wherein at least one of the alternating signal source, the analysis unit and the control device is/are configured in a manner such that the impedance of the measuring condenser is analyzed by measuring the resonance frequency of the resonator and one of the current that flows in resonance or the voltage of the analysis signal that is to be adjusted in resonance.

19. Capacitive sensor according to claim 14, wherein the measuring condenser forms a resonator wherein at least one of the alternating signal source, the analysis unit, and the control device is/are configured in a manner such that the resonance frequency of the resonator can be determined, and the measured resonance frequency of the resonator is compared to the specified or determined resonance frequency of the resonator in an uninfluenced state of the capacitive sensor, whereby the difference of the resonance frequencies of the resonator can be analyzed.

20. Capacitive sensor according to claim 14, wherein the measuring condenser forms a resonator wherein at least one of the analysis unit and the control device is/are configured in a manner such that the impedance of the measuring condenser can be analyzed by the resonator being operated at any frequency but at a fixed, selected frequency, and the current or voltage value of the analysis signal that is detected in the influenced state of the measuring condenser being compared to one of the current and voltage value of the analysis signal that is detected in the uninfluenced state of the measuring condenser.

* * * * *